US006944812B2

(12) United States Patent
Chevallier

(10) Patent No.: US 6,944,812 B2
(45) Date of Patent: Sep. 13, 2005

(54) MODE ENTRY CIRCUIT AND METHOD

(75) Inventor: Christophe J. Chevallier, Palo Alto, CA (US)

(73) Assignee: Micron Technology, Inc., Boise, ID (US)

( * ) Notice: Subject to any disclaimer, the term of this patent is extended or adjusted under 35 U.S.C. 154(b) by 604 days.

(21) Appl. No.: 10/050,404

(22) Filed: Jan. 15, 2002

(65) Prior Publication Data

US 2003/0135801 A1 Jul. 17, 2003

(51) Int. Cl.[7] .......................... G01R 31/00; G11C 7/00; G01N 27/416

(52) U.S. Cl. ........................ 714/745; 365/193; 324/433

(58) Field of Search ................................ 714/819, 820, 714/718, 733, 734, 745, 724; 365/200, 201, 189.07, 189.09, 193; 324/433, 522, 523

(56) References Cited

U.S. PATENT DOCUMENTS

| | | | | |
|---|---|---|---|---|
| 5,031,152 | A | 7/1991 | Doyle | 365/201 |
| 5,157,247 | A | * 10/1992 | Takahira | 235/492 |
| 5,384,741 | A | * 1/1995 | Haraguchi et al. | 365/201 |
| 5,526,364 | A | 6/1996 | Roohparvar | 371/22.1 |
| 5,559,744 | A | 9/1996 | Kuriyama et al. | 365/201 |
| RE35,645 | E | * 10/1997 | Tobita | 714/718 |
| 5,734,661 | A | 3/1998 | Roberts et al. | 371/22.5 |
| 6,006,347 | A | 12/1999 | Churchill et al. | 714/724 |
| 6,515,934 | B2 | * 2/2003 | Kobayashi et al. | 365/226 |
| 6,651,196 | B1 | 11/2003 | Iwase et al. | 714/724 |
| 6,760,865 | B2 | 7/2004 | Ledford et al. | 714/30 |
| 2003/0101362 | A1 | 5/2003 | Dia | 713/300 |
| 2004/0199841 | A1 | 10/2004 | Marr | 714/731 |

* cited by examiner

*Primary Examiner*—Christine T. Tu
(74) *Attorney, Agent, or Firm*—Dorsey & Whitney LLP

(57) ABSTRACT

An apparatus and method for generating an active mode activation signal in response to an input signal having a voltage exceeding the greater of two reference voltages by a voltage margin.

71 Claims, 4 Drawing Sheets

MODE ENTRY CIRCUIT AND METHOD

TECHNICAL FIELD

The present invention is related generally to the field of semiconductor memory devices, and more particularly, to circuitry included therein for generating test mode enable signals.

BACKGROUND OF THE INVENTION

In many memory devices, flexibility is added through the use different modes of operation in which the memory device can operate. Through the use of different operating modes, the memory device can perform operations or functions not typically desired by a user, but provide additional capabilities that may found desirable by memory device designers and manufacturers. For example, one popular mode of operation is the non-user test mode which provides additional test functionality that facilitates the testing of the memory devices.

There are many well known approaches to invoking the different modes of operation of a memory device. For example, entry into the test modes is often made by way of applying a relatively high-voltage signal to an input pin or pins of the memory device. The point at which the test mode is invoked, that is, the trigger voltage, is typically measured relative to a voltage source, such as the device supply voltage VCC or the input/output supply voltage VCCQ. Shown in FIG. 1 is a typical arrangement of circuitry 100 that is used to determine if a test mode has been invoked through the application of a relatively high-voltage to a device input pad, and in response, generate an output signal having a voltage level indicative of whether the test mode should be entered. The circuitry 100 includes a high-voltage detector 110 to which a reference voltage 112 and an input signal 114 are applied. As illustrated in FIG. 1, the reference voltage 112 is the device supply voltage VCC and the input signal 114 is an input signal PAD from a device input pad. The HV detector 110 compares the voltage of the PAD signal to VCC or a voltage level related to VCC, and in response, produces a test enable signal TEST_EN having a voltage indicating whether the test mode should be entered. The TEST_EN signal can then be used to place the device into a test mode. The design and implementation of HV detectors, such as the HV detector 110, are known in the art.

A problem with previously discussed approach of test mode entry, however, is that noisy signals or dramatic voltage variations in the signals applied to input pads of a memory device may inadvertently trigger entry into a test mode. Operation of the memory device after accidentally entering into such a mode by a user could irreparably damage the part. Consequently, the test mode entry voltage should be set high enough to avoid inadvertent test mode entry.

Further complicating the issue, however, is the fact that it may be desirable for the test mode entry voltage to be lower than that which will ensure a test mode is not inadvertently entered, such as in the following case. In order to increase test throughput, memory devices, test programs, and test equipment have been designed to perform device testing more efficiently. For example, memory devices have been designed to test multiple blocks of memory in parallel, thus avoiding the testing of memory cells one at a time. Additionally, test programs have been written to take advantage of the parallel testing capabilities provided by the memory devices, and test equipment have been modified to increase the number of devices that can be tested concurrently by the test equipment. However, the number of devices that can be tested concurrently may be limited by test equipment limitations. For example, memory testers typically have limited high-voltage drive capabilities. Thus, where high-voltage signals are applied during testing, the number of devices that can be tested concurrently will be limited. In the particular case where the high-voltage drive capabilities of the test equipment is limited, the test entry voltage should be reduced to accommodate this limitation. However, with the conventional high-voltage detection circuitry previously discussed with respect to FIG. 1, where the test mode entry voltage is based on one voltage, such as VCC, lowering the mode trigger voltage increases the likelihood that test mode will be entered inadvertently.

Additionally, many memory devices are designed to operate over a range of power supply voltages. In some cases, the device supply voltage and the input/output supply voltage can be at different voltage levels. Where this is the case, having the test mode entry voltage level based on one voltage, such as the device supply voltage, may significantly reduce the margin between the acceptable voltage levels of input signals and the test mode trigger voltage.

An approach to decreasing the likelihood of inadvertently entering a test mode, where entry is made through the application of high-voltage signals, is provided in U.S. Pat. No. 5,526,364 to Roohparvar. As described therein, high-voltage signals are applied to two or more input pins of the memory device to enter into a test mode. However, as previously discussed, where the test equipment has limited high-voltage drive capability, driving multiple pins to sufficient voltage levels to enter into the test modes will reduce the number of devices that can be tested concurrently. Thus, the approach described in the aforementioned patent may not provide an acceptable alternative.

Therefore, there is a need for an alternative apparatus and method that can be used to generate test mode entry signals in response to an input signal.

SUMMARY OF THE INVENTION

The present invention is directed to an apparatus and method for generating a mode activation signal in response to an input signal having a voltage exceeding the greater of two reference voltages by a voltage margin. The apparatus includes a voltage detector having an input for receiving the input signal, and first and second reference inputs for receiving first and second reference voltages, respectively. The voltage detector further includes an output at which an active mode activation signal is provided in response to the voltage of the input signal exceeding the greater of the voltages of the first and second reference voltages power supplies by a voltage margin.

DETAILED DESCRIPTION OF THE INVENTION

Embodiments of the present invention are directed to a mode entry circuit that generates an enable signal in response to the voltage of an input signal exceeding the greater of at least two references voltages. Certain details are set forth below to provide a sufficient understanding of the invention. However, it will be clear to one skilled in the art that the invention may be practiced without these particular details. In other instances, well-known circuits, control signals, and timing protocols have not been shown in detail in order to avoid unnecessarily obscuring the invention.

Figure 2:
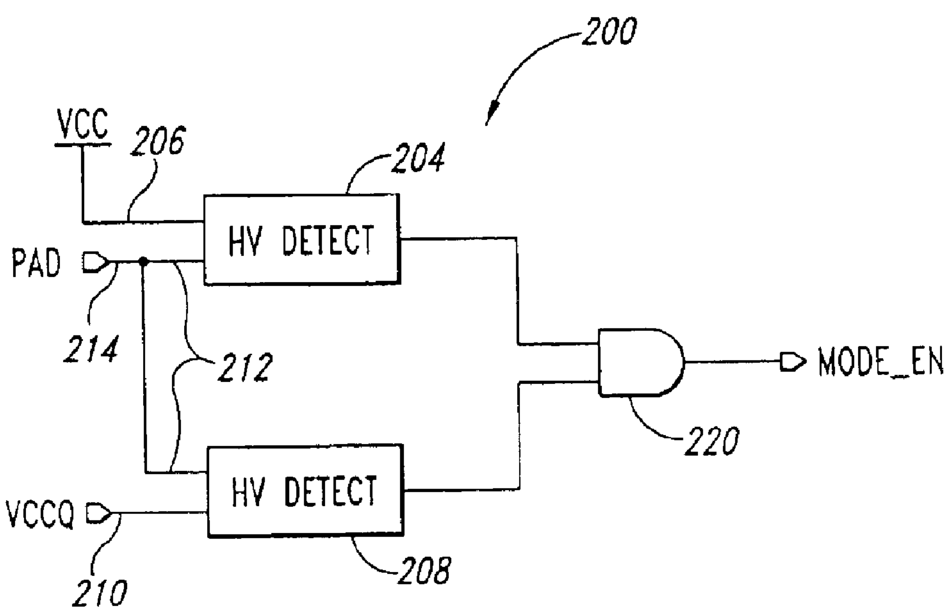
FIG. 2 is a block diagram of a mode entry circuit according to an embodiment of the present invention.

FIG. 2 illustrates a mode entry circuit 200 according to an embodiment of the present invention. The test mode entry circuit 200 includes a first high-voltage (HV) detector 204 having a reference voltage input 206 coupled to a device power supply VCC, and further includes a second HV detector 208 having a reference voltage input 210 coupled to an input/output power supply VCCQ. Both the HV detectors 204, 208 have an input 212 coupled to receive a signal PAD applied to an external device pad 214. The output of the HV detectors 204, 208 are provided to an AND gate 220 having an output at which a mode enable signal MODE_EN is provided.

In operation, each of the HV detectors 204, 208 provides a HIGH output signal in response to the voltage of the PAD signal exceeding the voltage of the respective reference voltages by a voltage margin. Consequently, an active MODE_EN signal is output by the AND gate 220 when the voltage of the PAD signal exceeds both the voltage of VCC and VCCQ by the voltage margin. From an alternative perspective, an active MODE_EN signal is provided when the voltage of the PAD signal exceeds the greater of VCC or VCCQ by the voltage margin. It will be appreciated that the voltage margin can be adjusted accordingly. In some instances, if desired, the voltage margin can be reduced to zero, thus mode entry will be made when the voltage of the PAD signal exceeds the greater of VCC or VCCQ. Additionally, it is not necessary for the voltage margins of the HV detectors 204, 208 to be the same.

Figure 1:
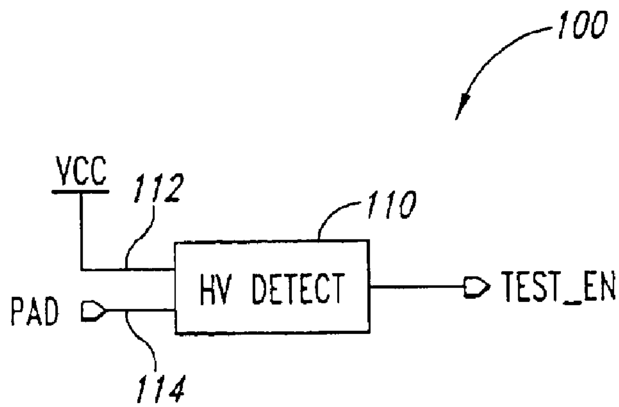
FIG. 1 is a block diagram of a conventional test mode entry circuit.

By having the generation of an active MODE_EN signal based on the greater of two voltages, the likelihood of inadvertent entry into a mode of operation in a device designed to operate at various power supply voltages can be reduced when compared to the conventional test mode circuit illustrated in FIG. 1. At the same time, the mode entry circuit 200 allows for lower VCC and VCCQ supply voltages can be used during testing of the devices to accommodate test equipment limitations.

For example, as previously mentioned, it is generally desirable during the testing of a device to set the voltage of both VCC and VCCQ to a lower operating voltage to account for test equipment limitations, such as limited high-voltage drive capabilities. Entry into a mode of operation is then made through the application of a PAD signal having a relatively high voltage with respect to the lower operating voltages of VCC and VCCQ. However, where the device will then be used in an environment that requires two different power supply voltages, such as when the voltage of VCCQ is greater than VCC, the likelihood of inadvertent entry into a mode of operation increases in the conventional case because mode entry based on the voltage of a PAD signal is with respect to only VCC or only VCCQ. That is, in the case where the mode trigger voltage is based on only VCC, and VCCQ is greater than VCC, variations in the voltage of a PAD signal, which has a voltage level based on VCCQ, may be large enough to exceed the trigger voltage, and a mode of operation will be inadvertently entered. However, simply raising the mode trigger voltage to prevent inadvertent entry into a mode of operation reintroduces the problems associated with limitations in test equipment.

In contrast, the mode entry circuit 200 avoids the aforementioned problem because generation of the MODE_EN signal is based on the greater of two voltages, such as VCC and VCCQ, and not one or the other. Thus, with a device including the mode entry circuit 200, testing of the device can be made with both VCC and VCCQ at the lower operating voltage, and when the device is required to operate at two different supply voltages, the mode trigger voltage will be adjusted to accommodate the increased voltage of whichever power supply has the greater voltage. With the mode entry circuit 200, either the VCC or VCCQ power supply can have a higher voltage and the mode trigger voltage will change accordingly. For example, in the previous example, VCCQ was greater than VCC, and entry into a mode of operation was made by applying a PAD signal having a voltage that exceeded VCCQ by a voltage margin. However, if the situation arises where it is desirable to have VCC greater than VCCQ, entry into a mode of operation will be made if the voltage of the PAD signal exceeds the voltage of VCC by a voltage margin.

Figure 3:
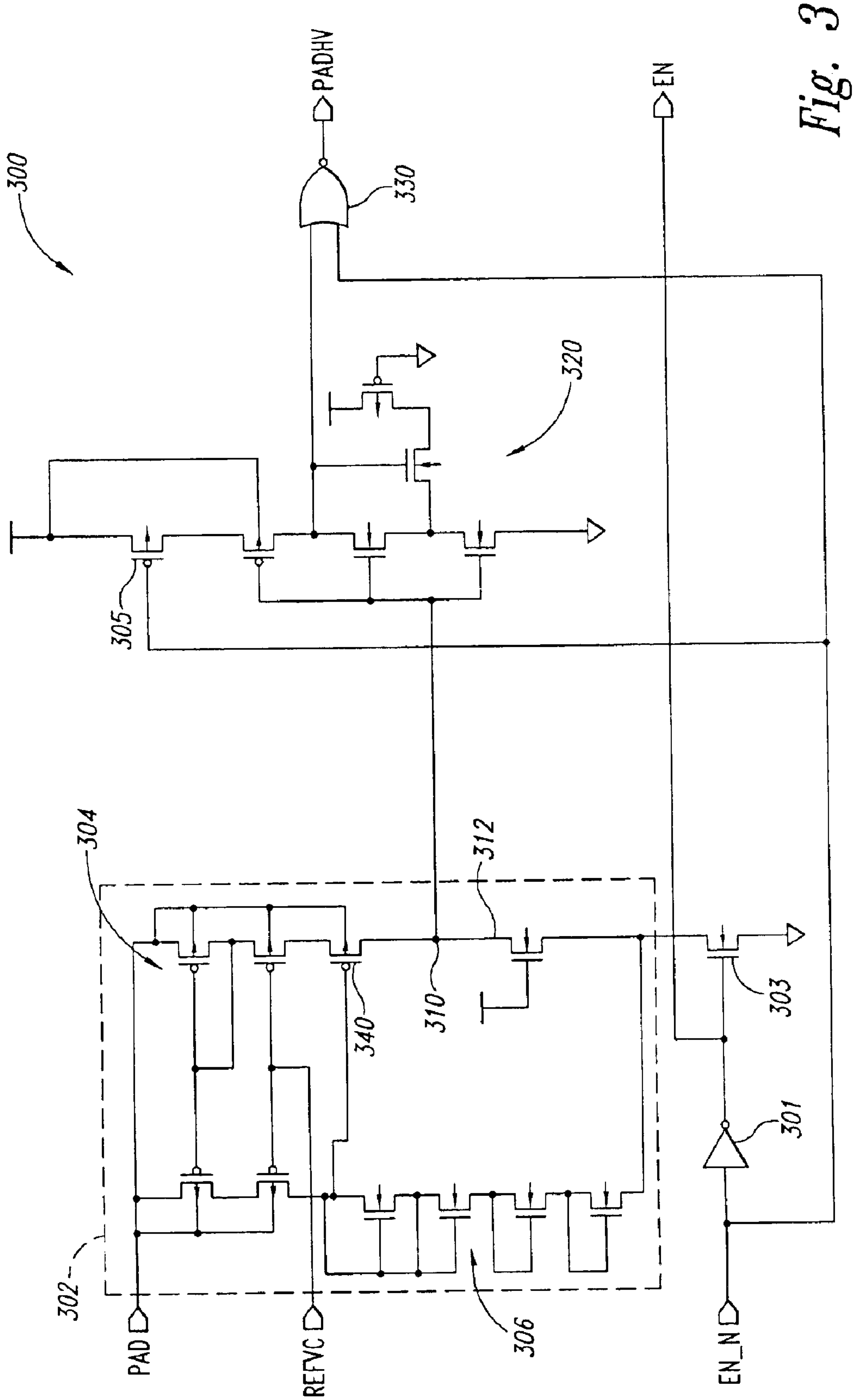
FIG. 3 is a schematic drawing of a high-voltage detector according to an embodiment of the present invention that may be used in the mode entry circuit of FIG. 2.

FIG. 3 illustrates a HV detector 300 that can be substituted for the HV detectors 204, 208 of FIG. 2. As illustrated in FIG. 3, the HV detector 300 includes enable circuitry formed from an inverter 301 that receives a circuit enable signal EN_N, which as illustrated in FIG. 3 is active when the signal is LOW. The enable circuitry also includes an NMOS transistor 303 and a PMOS transistor 305, which are both switched ON when the EN_N signal is LOW. The EN_N signal is provided by control circuitry (not shown) that generates the appropriate EN_N signal in response to external memory commands. The generation of such an EN_N signal is well known in the art. It will be appreciated that the enable circuitry illustrated in FIG. 3 can be modified, or even eliminated from the HV detector 300 without departing from the scope of the present invention.

The HV detector 300 further includes a voltage comparator stage 304. The voltage comparator stage includes both PMOS load elements 304 and NMOS load elements 306 to set the mode trigger voltage relative to the input reference voltage REFVC. It will be appreciated that adjusting the dimensions of the PMOS and NMOS load elements 304, 306 will change the mode trigger voltage. However, those of ordinary skill have sufficient understanding of the art to use alternative means to adjust the mode trigger voltage. An output signal HVDETECT is provided by the voltage comparator stage 304 at an output 310. In the case where PAD does not exceed REFVC by the voltage margin set by the PMOS and NMOS load elements 304, 306, the transistor 340 remains OFF and the output 310 is held LOW through NMOS transistors 312 and 303. However, if the voltage of REFVC exceeds the voltage of REFVC by the voltage margin, the transistor 340 is switched ON, and pulls the output 310 HIGH to provide an active HVDETECT signal. The HVDETECT signal is provided to the input of a Schmitt trigger 320. The hysteresis of the Schmitt trigger 320 prevents its output from switching from minor voltage variations in the HVDETECT signal that may result from variations in either the PAD or REFVC signals.

A two-input NOR gate 330 is coupled to receive the output of the Schmitt trigger 330 and the EN_N signal. As mentioned previously, the EN_N signal is active when LOW. Consequently, when the EN_N signal is active, the logic state of the output signal from the Schmitt trigger 330 is inverted by the NOR gate 330 to provide an output signal PADHV that is HIGH when the voltage of the PAD signal exceeds the voltage of the REFVC signal by at least the voltage margin established by the PMOS and NMOS load elements 304, 306. Otherwise, the PADHV signal is LOW. As illustrated in FIG. 2, the PADHV signal is provided to AND gate 220, which in turn generates the MODE_EN signal. Although FIG. 3 illustrates a particular HV detector 300, it will be appreciated that alternative HV voltage detection circuitry can be used in the mode entry circuit 200 without departing from the scope of the present invention. Such alternative voltage detection circuitry are well known by those ordinarily skilled in the art.

Figure 4:
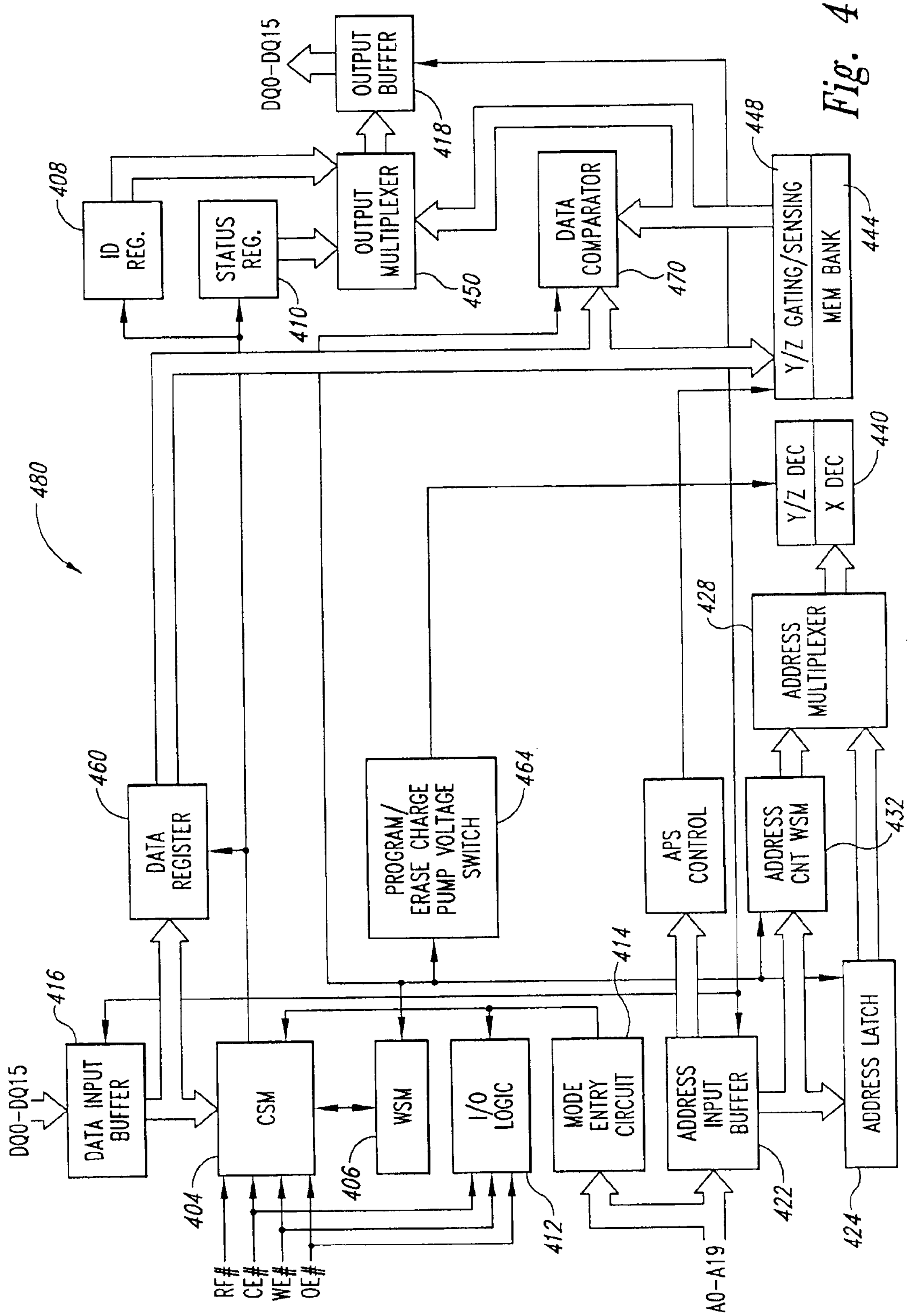
FIG. 4 is a block diagram of a memory device including the mode entry circuit of FIG. 2.

FIG. 4 illustrates a non-volatile memory device 400 including a mode entry circuit 414 according to an embodiment of the present invention incorporated therein. Commands are issued to a command state machine (CSM) 404 which acts as an interface between the an external processor (not shown) and an internal write state machine (WSM) 408. When a specific command is issued to the CSM 404, internal command signals are provided to the WSM 408, which in turn, executes the appropriate algorithm to generate the necessary timing signals to control the memory device 400 internally, and accomplish the requested operation. The CSM 404 also provides the internal command signals to an ID register 408 and a status register 410, which allows the progress of various operations to be monitored when interrogated by issuing to the CSM 404 the appropriate command.

Portions of the commands are also provided to input/output (I/O) logic 412 which, in response to a read or write command, enables the data input buffer 416 and the output buffer 418, respectively. The I/O logic 412 also provides signals to the address input buffer 422 in order for address signals to be latched by an address latch 424. The latched address signals are in turn provided by the address latch 424 to an address multiplexer 428 under the command of the WSM 406. The address multiplexer 428 selects between the address signals provided by the address latch 424 and those provided by an address counter 432. The address signals provided by the address multiplexer 428 are used by an address decoder 440 to access the memory cells of a memory bank 444 that correspond to the address signals. A gating/sensing circuit 448 is coupled to the memory bank 444 for the purpose of programming and erase operations, as well as for read operations.

During a read operation, data is sensed by the gating/sensing circuit 448 and amplified to sufficient voltage levels before being provided to an output multiplexer 450. The read operation is completed when the WSM 406 instructs the output buffer 418 to latch data provided from the output multiplexer 450 to be provided to the extern processor. The output multiplexer 450 can also select data from the ID and status registers 408, 410 to be provided to the output buffer 418 when instructed to do so by the WSM 406. During a program or erase operation, the I/O logic 412 commands the data input buffer 416 to provide the data signals to a data register 460 to be latched. The WSM 406 also issues commands to program/erase circuitry 464 which uses the address decoder 440 to carry out the process of injecting or removing electrons from the memory cells of the memory bank 444 to store the data provided by the data register 460 to the gating sensing circuit 448. To ensure that sufficient programming or erasing has been performed, a data comparator 470 is instructed by the WSM 406 to compare the state of the programmed or erased memory cells to the data latched by the data register 460.

As illustrated in FIG. 4, the address signals are also provided to the mode entry circuit 414 to initiate a mode of operation through the application of a relatively high voltage signal. An active mode enable signal is generated by the mode entry circuit 414 in response to an address signal or signals having the sufficient voltage level, and is provided to the CSM 404 and the I/O logic 412 to indicate that a mode of operation has been triggered. The CSM 404 and the I/O logic 412 then generate the appropriate internal command and timing signals to initiate the mode of operation.

It will be appreciated that the embodiment of the memory device 400 that is illustrated in FIG. 4 has been provided by way of example and that the present invention is not limited thereto. Those of ordinary skill in the art have sufficient understanding to modify the previously described memory device embodiment to implement embodiments of the mode entry circuit. For example, the mode entry circuit 414 is represented in FIG. 4 as a separate circuit block. However, the mode entry circuit 414 may be incorporated into one of the other circuit blocks, or alternatively, may be split among several circuit blocks. The particular arrangement of the mode entry circuit 414 within a memory device will be a matter of design preference. Additionally, although initiation of a mode of operation has been described herein as being triggered by a relatively high voltage address signal or signals, it will be appreciated that other types of signals could be used to invoke the mode of operation as well. For example, control signals could be provided to the mode entry circuit 414 in addition to or instead of the address signals, as previously discussed, and used to trigger a mode of operation. Such types of modifications may be made without departing from the scope of the present invention.

Figure 5:
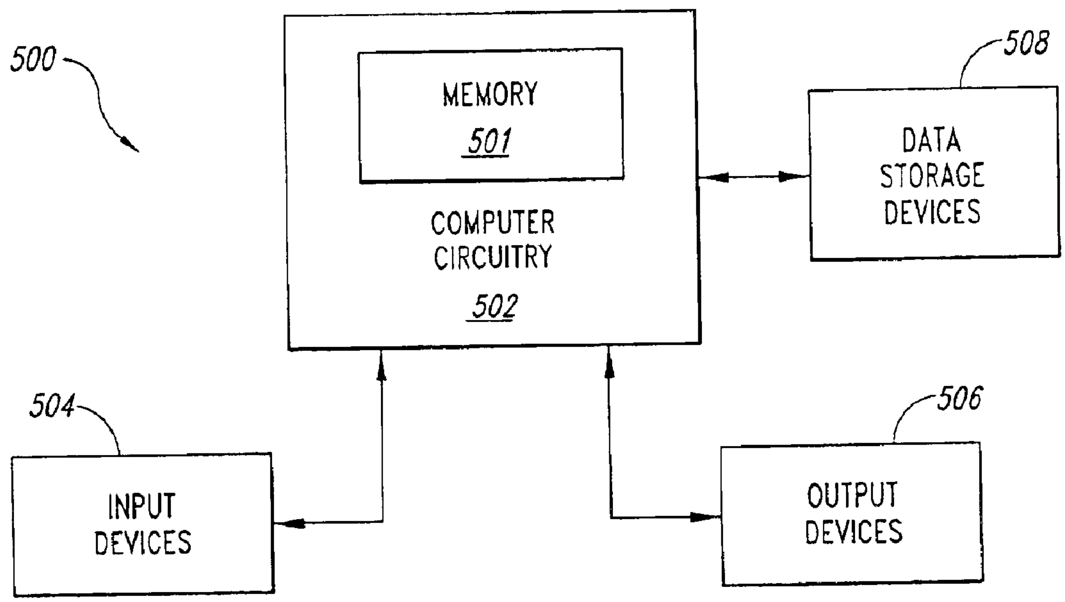
FIG. 5 is a block diagram of a computer system including the memory device of FIG. 4.

FIG. 5 is a block diagram of a computer system 500 including computing circuitry 502. The computing circuitry 502 contains a memory device 501 that includes a mode entry circuit according to an embodiment of the present invention. The computing circuitry 502 performs various computing functions, such as executing specific software to perform specific calculations or tasks. In addition, the computer system 500 includes one or more input devices 504, such as a keyboard or a mouse, coupled to the computer circuitry 502 to allow an operator to interface with the computer system. Typically, the computer system 500 also includes one or more output devices 506 coupled to the computer circuitry 502, such output devices typically being a printer or a video terminal. One or more data storage devices 508 are also typically coupled to the computer circuitry 502 to store data or retrieve data from external storage media (not shown). Examples of typical storage devices 508 include hard and floppy disks, tape cassettes, and compact disc read-only memories (CD-ROMs). The computer circuitry 502 is typically coupled to the memory device 501 through appropriate address, data, and control busses to provide for writing data to and reading data from the memory device 501.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A method for generating a mode activation signal in response to an input signal, comprising:

comparing the voltage of the input signal to the voltage of a first power supply;

comparing the voltage of the input signal to the voltage of a second power supply; and where the voltage of the input signal exceeds the greater of the voltages of the first and second power supplies, generating in response thereto an active mode activation signal.

2. The method of claim 1 wherein generating an active mode activation signal comprises generating an active mode activation signal where the voltage of the input signal exceeds the greater of the voltages of the first and second power supplies by a voltage margin.

3. The method of claim 1 wherein comparing the voltage of the input signal to the voltage of the first power supply comprises comparing the voltage of the input signal to the voltage of a device power supply.

4. The method of claim 1 wherein comparing the voltage of the input signal to the voltage of the second power supply comprises comparing the voltage of the input signal to the voltage of an input/output power supply.

5. The method of claim 1 wherein comparing the voltage of the input signal to the voltages of the first and second power supplies comprise comparing the voltage of the input signal to the voltages of a device power supply and an input/output power supply, the voltage of the device power supply being less than the voltage of the an input/output power supply.

6. A method for generating a mode activation signal in response to an input signal, comprising determining whether the voltage of the input signal exceeds the voltage of the first power supply and the voltage of the second power supply by at least a voltage margin and generating an active mode activation signal in response thereto.

7. The method of claim 6 wherein determining whether the voltage of the input signal exceeds the voltages of the first and second power supplies comprises determining whether the voltage of the input signal exceeds the voltages of a device power supply and an input/output power supply.

8. The method of claim 6 wherein determining comprises:

comparing the voltage of the input signal to the voltage of the first power supply and generating a first true signal in response to the input signal having a voltage greater than the first power supply by the voltage margin; and comparing the voltage of the input signal to the voltage of the second power supply and generating a second true signal in response to the input signal having a voltage greater than the second power supply by the voltage margin.

9. The method of claim 8 wherein generating an active mode activation signal comprises generating the active mode activation signal in response to the generation of the first and second true signals.

10. A method for testing a memory device having a voltage operation range including an upper and lower operating voltage, the method comprising:

setting a first power supply voltage;

setting a second power supply voltage;

applying an input signal having an input voltage to an input pin of the memory device to enter a test mode;

comparing the input voltage to the first voltage;

comparing the input voltage to the second voltage;

where the input voltage exceeds the greater of the first and second voltages by a voltage margin, generating in response thereto an active mode activation signal to enter the test mode.

11. The method of claim 10 wherein the first and second power supply voltages are set to the lower operating voltage.

12. The method of claim 10 wherein the first and second power supply voltages are set to unequal voltages.

13. The method of claim 10 wherein setting the first voltage comprises setting the voltage of a device power supply.

14. The method of claim 10 wherein setting the second voltage comprises setting the voltage of a input/output power supply.

15. The method of claim 10 wherein the voltage of the input signal is based on the voltage of the second voltage.

16. A method for testing a memory device having a voltage operation range including an upper and lower operating voltage, the method comprising:

setting a first power supply voltage;

setting a second power supply voltage;

applying an input signal having an input voltage to an input pin of the memory device to enter a test mode; and determining whether the input voltage exceeds the voltage of the first power supply and the voltage of the second power supply by at least a voltage margin and generating an active mode activation signal in response thereto.

17. The method of claim 16 wherein the first and second power supply voltages are set to the lower operating voltage.

18. The method of claim 16 wherein the first and second power supply voltages are set to unequal voltages.

19. The method of claim 16 wherein setting the first voltage comprises setting the voltage of a device power supply.

20. The method of claim 16 wherein setting the second voltage comprises setting the voltage of a input/output power supply.

21. The method of claim 16 wherein the voltage of the input signal is based on the voltage of the second voltage.

22. The method of claim 16 wherein determining comprises:

comparing the voltage of the input signal to the voltage of the first power supply and generating a first true signal in response to the input signal having a voltage greater than the first power supply by the voltage margin; and comparing the voltage of the input signal to the voltage of the second power supply and generating a second true signal in response to the input signal having a voltage greater than the second power supply by the voltage margin.

23. The method of claim 22 wherein generating an active mode activation signal comprises generating the active mode activation signal in response to the generation of the first and second true signals.

24. An apparatus for generating a mode activation signal in response to an input signal, comprising a high-voltage detector having an input for receiving the input signal, and first and second reference inputs for receiving first and second reference voltages, respectively, the high-voltage detector further having an output at which an active mode activation signal is provided in response to the voltage of the input signal exceeding the greater of the voltages of the first and second reference voltages power supplies by a voltage margin.

25. The apparatus of claim 24 wherein the high voltage detector comprises:

a first voltage comparator having a reference input for receiving the first reference voltage and an input for receiving the input signal, the first voltage comparator further having an output at which an active output signal is provided in response to the voltage of the input signal exceeding the voltage of the first reference voltage by the first voltage margin; and a second voltage comparator having a reference input for receiving the second reference voltage and an input for receiving the input signal, the second voltage comparator further having an output at which an active output signal is provided in response to the voltage of the input signal exceeding the voltage of the second reference voltage by the second voltage margin.

26. The apparatus of claim 25 wherein the high voltage detector further comprises a logic circuit having a first input coupled to the output of the first voltage comparator and a second input coupled to the output of the second voltage comparator, the logic gate further having an output at which an active mode activation signal is provided in response to receiving active output signals from the first and second voltage comparators.

27. The apparatus of claim 26 wherein the logic gate comprises a two-input boolean AND gate.

28. The apparatus of claim 26 wherein the first and second voltage comparators comprise:

a voltage divider having a node at which a voltage is controlled by the voltage of the respective reference voltage relative to the voltage of the input signal; and an inverter having an input coupled to the node of the voltage divider and further having an output coupled to the output of the high voltage detector.

29. The apparatus of claim 28 wherein the first and second voltage comparator further comprise a Schmitt trigger circuit having an input coupled to the output of the inverter and an output coupled to the output of the high voltage detector.

30. The apparatus of claim 24 wherein the first and second reference voltages comprise a device power supply voltage and an input/output power supply voltage, respectively.

31. The apparatus of claim 30 wherein the device power supply voltage is less than the input/output power supply voltage.

32. The apparatus of claim 30 wherein the device power supply voltage is greater than the input/output power supply voltage.

33. The apparatus of claim 24 wherein the first and second voltage margins are approximately equal.

34. An apparatus for generating a mode activation signal in response to an input signal, comprising:

a first high voltage detector having a reference input for receiving a first reference voltage and an input for receiving the input signal, the first high voltage detector further having an output at which an active output signal is provided in response to the voltage of the input signal exceeding the voltage of the first reference voltage by a first voltage margin;

a second high voltage detector having a reference input for receiving a second reference voltage and an input for receiving the input signal, the second high voltage detector further having an output at which an active output signal is provided in response to the voltage of the input signal exceeding the voltage of the second reference voltage by a second voltage margin; and a logic gate having a first input coupled to the output of the first high voltage detector and a second input coupled to the output of the second high voltage detector, the logic gate further having an output at which an active mode activation signal is provided in response to receiving active output signals from the first and second high voltage detectors.

35. The apparatus of claim 34 wherein the first and second high voltage detectors comprise:

a voltage divider having a node at which a voltage is controlled by the voltage of the respective reference signal relative to the voltage of the input signal; and an inverter having an input coupled to the node of the voltage divider and further having an output coupled to the output of the high voltage detector.

36. The apparatus of claim 35 wherein the first and second high voltage detectors further comprise a Schmitt trigger circuit having an input coupled to the output of the inverter and an output coupled to the output of the high voltage detector.

37. The apparatus of claim 35 wherein the first and second reference voltages comprise a device power supply voltage and an input/output power supply voltage, respectively.

38. The apparatus of claim 37 wherein the device power supply voltage is less than the input/output power supply voltage.

39. The apparatus of claim 37 wherein the device power supply voltage is greater than the input/output power supply voltage.

40. The apparatus of claim 34 wherein the logic gate comprises a two-input boolean AND gate.

41. The apparatus of claim 34 wherein the first and second voltage margins are approximately equal.

42. A test mode entry circuit for generating a test mode activation signal in response to an input signal, comprising:

a plurality of voltage comparators, each voltage comparator having a reference input for receiving a respective reference voltage and an input for receiving the input signal, each voltage comparator further having an output at which a respective active output signal is provided in response to the voltage of the input signal exceeding the voltage of the respective reference voltage; and a logic circuit having a corresponding plurality of inputs coupled to the output of a respective voltage comparator, the logic circuit further having an output at which an active test mode activation signal is provided in response to receiving active output signals from all of the plurality of voltage comparators.

43. The test mode entry circuit of claim 42 wherein the plurality of voltage comparators generate a respective active output signal in response to the voltage of the input signal exceeding the voltage of the respective reference voltage by a respective voltage margin.

44. The test mode entry circuit of claim 43 wherein the respective voltage margins are approximately equal.

45. The test mode entry circuit of claim 42 wherein the logic circuit comprises a logical AND gate.

46. An apparatus for generating a mode activation signal in response to an input signal, comprising:

a comparing means for comparing the voltage of the input signal to the voltages of first and second power supplies; and a mode activation circuit coupled to the comparing means, the mode activation circuit generating an active mode activation signal in response to the voltage of the input signal exceeding the greater of the voltages of the first and second power supplies.

47. The apparatus of claim 46 wherein the mode activation circuit generates an active mode in response to the voltage of the input signal exceeding the greater of the voltages of the first and second power supplies by a voltage margin.

48. The apparatus of claim 46 wherein the first power supply comprises a device power supply.

49. The apparatus of claim 46 wherein the second power supply comprises an input/output power supply.

50. The apparatus of claim 46 wherein the first and second power supplies comprise a device power supply and an input/output power supply, respectively.

51. The apparatus of claim 50 wherein voltage of the device power supply is less than the voltage of the input/output power supply.

52. A memory device, comprising:

an address bus;

a control bus;

a data bus;

an address decoder coupled to the address bus;

a read/write circuit coupled to the data bus;

a memory-cell array coupled to the address decoder, control circuit, and read/write circuit; and a mode entry circuit coupled to the control bus to generate a mode activation signal in response to an input signal, the mode entry circuit comprising a high-voltage detector having an input for receiving the input signal, and first and second reference inputs for receiving first and second reference voltages, respectively, the high-voltage detector further having an output at which an active mode activation signal is provided in response to the voltage of the input signal exceeding the greater of the voltages of the first and second reference voltages power supplies by a voltage margin.

53. The memory device of claim 52 wherein the high voltage detector of the mode entry circuit comprises:

a first voltage comparator having a reference input for receiving the first reference voltage and an input for receiving the input signal, the first voltage comparator further having an output at which an active output signal is provided in response to the voltage of the input signal exceeding the voltage of the first reference voltage by the first voltage margin; and a second voltage comparator having a reference input for receiving the second reference voltage and an input for receiving the input signal, the second voltage comparator further having an output at which an active output signal is provided in response to the voltage of the input signal exceeding the voltage of the second reference voltage by the second voltage margin.

54. The memory device of claim 53 wherein the high voltage detector further comprises a logic circuit having a first input coupled to the output of the first voltage comparator and a second input coupled to the output of the second voltage comparator, the logic gate further having an output at which an active mode activation signal is provided in response to receiving active output signals from the first and second voltage comparators.

55. The memory device of claim 54 wherein the logic gate comprises a two-input boolean AND gate.

56. The memory device of claim 53 wherein the first and second voltage comparators comprise:

a voltage divider having a node at which a voltage is controlled by the voltage of the respective reference voltage relative to the voltage of the input signal; and an inverter having an input coupled to the node of the voltage divider and further having an output coupled to the output of the high voltage detector.

57. The memory device of claim 56 wherein the first and second voltage comparator further comprise a Schmitt trigger circuit having an input coupled to the output of the inverter and an output coupled to the output of the high voltage detector.

58. The memory device of claim 52 wherein the first and second reference voltages comprise a device power supply voltage and an input/output power supply voltage, respectively.

59. The memory device of claim 58 wherein the device power supply voltage is less than the input/output power supply voltage.

60. The memory device of claim 58 wherein the device power supply voltage is greater than the input/output power supply voltage.

61. The memory device of claim 52 wherein the first and second voltage margins are approximately equal.

62. A computer system, comprising:

a data input device;

a data output device;

a processor coupled to the data input and output devices; and a memory device coupled to the processor, the memory device comprising:

an address bus;

a control bus;

a data bus;

an address decoder coupled to the address bus;

a read/write circuit coupled to the data bus;

a memory-cell array coupled to the address decoder, control circuit, and read/write circuit; and a mode entry circuit coupled to the control bus to generate a mode activation signal in response to an input signal, the mode entry circuit comprising a high-voltage detector having an input for receiving the input signal, and first and second reference inputs for receiving first and second reference voltages, respectively, the high-voltage detector further having an output at which an active mode activation signal is provided in response to the voltage of the input signal exceeding the greater of the voltages of the first and second reference voltages power supplies by a voltage margin.

63. The computer system of claim 62 wherein the high voltage detector of the mode entry circuit comprises:

a first voltage comparator having a reference input for receiving the first reference voltage and an input for receiving the input signal, the first voltage comparator further having an output at which an active output signal is provided in response to the voltage of the input signal exceeding the voltage of the first reference voltage by the first voltage margin; and a second voltage comparator having a reference input for receiving the second reference voltage and an input for receiving the input signal, the second voltage comparator further having an output at which an active output signal is provided in response to the voltage of the input signal exceeding the voltage of the second reference voltage by the second voltage margin.

64. The computer system of claim 63 wherein the high voltage detector further comprises a logic circuit having a first input coupled to the output of the first voltage comparator and a second input coupled to the output of the second voltage comparator, the logic gate further having an output at which an active mode activation signal is provided in response to receiving active output signals from the first and second voltage comparators.

65. The computer system of claim 64 wherein the logic gate comprises a two-input boolean AND gate.

66. The computer system of claim 63 wherein the first and second voltage comparators comprise:

a voltage divider having a node at which a voltage is controlled by the voltage of the respective reference voltage relative to the voltage of the input signal; and an inverter having an input coupled to the node of the voltage divider and further having an output coupled to the output of the high voltage detector.

67. The computer system of claim 66 wherein the first and second voltage comparator further comprise a Schmitt trigger circuit having an input coupled to the output of the inverter and an output coupled to the output of the high voltage detector.

68. The computer system of claim 62 wherein the first and second reference voltages comprise a device power supply voltage and an input/output power supply voltage, respectively.

69. The computer system of claim 68 wherein the device power supply voltage is less than the input/output power supply voltage.

70. The computer system of claim 68 wherein the device power supply voltage is greater than the input/output power supply voltage.

71. The computer system of claim 62 wherein the first and second voltage margins are approximately equal.

* * * * *